United States Patent [19]

Lee et al.

[11] Patent Number: 4,951,123
[45] Date of Patent: Aug. 21, 1990

[54] INTEGRATED CIRCUIT CHIP ASSEMBLY UTILIZING SELECTIVE BACKSIDE DEPOSITION

[75] Inventors: Soong H. Lee, Potomac, Md.; Chun L. Lau, Colorado Springs, Colo.; Daniel C. Buck, Hanover; Dale E. Dawson, Glen Burnie, both of Md.

[73] Assignee: Westinghouse Electric Corp., Pittsburgh, Pa.

[21] Appl. No.: 252,234

[22] Filed: Sep. 30, 1988

[51] Int. Cl.⁵ .................................. H01L 23/02
[52] U.S. Cl. .............................. 357/81; 333/246; 333/33; 357/80
[58] Field of Search .................. 357/23.4, 81, 74, 80; 333/238, 246, 247; 361/386; 437/284

[56] References Cited

U.S. PATENT DOCUMENTS

| | | | |
|---|---|---|---|
| 3,561,107 | 2/1971 | Best et al. | 29/577 |
| 3,591,839 | 7/1971 | Evans | 317/234 |
| 3,593,070 | 7/1971 | Reed | 357/81 |
| 3,871,014 | 3/1975 | King et al. | 357/67 |
| 4,034,468 | 7/1977 | Koopman | 29/628 |
| 4,067,104 | 1/1978 | Tracy | 29/626 |
| 4,402,004 | 8/1983 | Iwasaki | 357/79 |
| 4,499,659 | 2/1985 | Varteresian et al. | 29/589 |
| 4,509,096 | 4/1985 | Baldwin et al. | 361/386 |
| 4,536,469 | 8/1985 | Adlerstein | 430/314 |
| 4,561,011 | 12/1985 | Kohara et al. | 356/81 |
| 4,589,116 | 5/1986 | Westermeier | 372/36 |
| 4,788,627 | 11/1988 | Ehlert et al. | 357/81 |

FOREIGN PATENT DOCUMENTS 54-138370 10/1979 Japan ...................... 357/81

Primary Examiner—Rolf Hille
Assistant Examiner—Minh Loan Tran
Attorney, Agent, or Firm—J. G. Porcelli

[57] ABSTRACT

The invention is an improved integrated circuit chip assembly which provides enhanced heat transfer from active electronic devices of the integrated circuit by significantly reducing the thickness of the substrate and providing the necessary structural support through a thermally conducting spacing segment between the substrate and a ground plane in the region of the active electronic devices. This improvement further permits added flexibility in the design of transmission lines by permitting adjustment of the distance between the transmission line and the ground plane and furthermore by permitting the introduction of a second dielectric material such that the impedance of the transmission line may be controlled.

41 Claims, 3 Drawing Sheets

INTEGRATED CIRCUIT CHIP ASSEMBLY UTILIZING SELECTIVE BACKSIDE DEPOSITION

BACKGROUND OF THE INVENTION

This invention relates to integrated circuitry and more particularly to an improved integrated circuit chip assembly.

Integrated circuit (IC) technology is central to electronics systems in use today because it improves system reliability, increases system performance and decreases system size, weight, power and cost. An integrated circuit is an interconnected array of active electronic devices, such as transistors and diodes, with passive components, such as resistors and capacitors, fabricated from a single crystal of semiconductor material bY etching, doping and diffusion. Throughout the discussion the term device will be used to describe active electronic devices while the term component will be used to describe generally both active devices and passive components An integrated circuit chip is capable of performing at least one and sometimes many complete circuit functions.

Of major concern to integrated circuit chip assembly designers is the heat generated by the active electronic devices This is especially true with power devices. The overall chip design must provide a functional assembly but also must be designed to permit sufficient heat dissipation of the heat generated by the active electronic devices of the integrated circuit.

FIG. 1 shows the cross-section of a portion of a typical integrated circuit chip assembly 10 and shows one active electronic device 12 (encircled) and one microstrip transmission line 14. Throughout this discussion reference will be made to transmission lines but it should be understood that strictly speaking these are microstrip transmission lines. Microstrip transmission lines provide a microwave path and are used for the interconnection of the many components typically comprising an integrated circuit.

Generally, a typical assembly 10 is comprised of a substrate 16 made of a semi-conductor material such as silicon, silicon-on-sapphire (SOS), or gallium arsenide (GaAs). Substrate thickness is about 4 mils. The choice of the substrate material depends on the circuit properties required. In the assembly 10 across a first surface 18 of the substrate 16 a uniform dielectric layer 20 is deposited. A typical layer thickness would be about 0.004 to .008 mils. Note that while a substrate made from silicon or silicon-on-sapphire has an electrical resistivity on the order of magnitude of 10 ohm-cm and therefore requires a dielectric layer such as layer 20 for electrical isolation from transmission and component circuit lines, a substrate made from gallium arsenide, on the other hand, has a resistivity on the order of $10^7$ ohm-cm and therefore requires no such layer. This is illustrated in FIG. 2 and will be further discussed later. Referring again to FIG. 1, which could be an assembly using either silicon or silicon-on-sapphire as the substrate material, the transmission line 14 is deposited upon this dielectric layer 20 and therefore insulated only from the substrate 16 by this layer 20. A typical thickness for a transmission line would be about 2 to 4 mils. The electronic device 12, however, exists within and upon the substrate 16 and may utilize the dielectric layer 20 as a means to isolate elements of the electronic device 12. For illustrative purposes, the electronic device 12 is assumed to be a field effect transistor (FET) which during operation generates heat which must be effectively removed to avoid damage to the surrounding circuitry and to avoid degradation of the device itself. A cursory description of a FET, which is typical of heat generating electronic devices, will be provided.

For the FET shown as the electronic device 12 in FIG. 1, given a substrate 16 of a specific material such as silicon or silicon-on-sapphire, a dope additive, that is a specific impurity added to a pure semiconductor to give it required electrical properties, is introduced into the substrate to form a doped source region 22, a doped drain region 24 and a doped channel region 32. Generally the width of the FET is approximately 0.2 mil and the length extends across the face of the substrate, which is about 0.2 inches. To form the wires which supply power and also interconnect the FET, thin circuit lines 26, 28, 30 of electrically conductive material are deposited upon the first surface 18 of the substrate 16 and upon the surface of the dielectric layer 20. Thin films of deposited materials, such as the dielectric layer 20, are used to provide dielectric isolation between the circuit line 28 of electrically conductive material and the substrate 16. Generally the thickness of the circuit lines is approximately 0.08 to 0.16 mils. Note that circuit lines 26 and 30 contact the first surface 18 of the substrate 16. Selective removal of portions of the dielectric layer 20, which may be done using conventional etching techniques, are necessary for this. The doped channel region 32 exists in the substrate 16 between the doped source region 22 and the doped drain region 24. Characteristic of an FET, the resistance of the channel region 32 can be altered by appropriately altering the applied voltage, also known as the gate voltage, through circuit line 28. Based on the voltage through circuit line 28, a current supplied to circuit line 26 will pass from circuit line 26 into the doped source region 22 and through the doped channel region 32 to the doped drain region 24 into the circuit line 30. Current utilized for the operation of the FET generates a significant amount of heat, especially in the channel region 32, that must be removed in some manner and this goal is a significant factor in the overall design of an integrated circuit chip assembly.

In current microwave IC chip assembly designs, structural support of the assembly is provided entirely through the substrate 16 and as a result heat dissipation is hampered by the substrate thickness, which is structurally necessary. Furthermore a ground plane 34 is provided against a second surface 36 of the substrate 16 which may act both as an electrical ground and a thermal heat sink. Note the same substrate thickness that provides mechanical support also acts to space the transmission lines relative to the ground plane and this distance between the transmission lines to the ground plane strongly effects the impedance of the transmission line.

Addressing the substrate thickness relative to the effective heat transfer, absent a requirement for the substrate 16 to provide structural support to the chip assembly, much more flexibility would be available to adjust the substrate thickness to maximize heat transfer and to influence the impedance of the transmission lines. The substrate 16 minimum thickness would be limited only by the need to provide enough thickness for the doped source region 22, the doped drain region 24 and the channel region 32 to exist on the substrate 16. The transmission lines may then be spaced from the ground plane a minimum distance of the substrate reduced thickness and the maximum distance would be essentially independent of the substrate thickness. Theoretically, the substrate could then be reduced to a thickness of 1 or 2 mils from the typical thickness of 4 mils. For heat transfer between the electronic device 12 and the thermal heat sink in the ground plane 34, this small distance would be ideal. However, currently substrates are sized with considerable weight given to both the desired impedance of the transmission lines and the necessary structural support required for the entire integrated circuit chip assembly and this dictates a substrate thickness that may not be optimum for heat transfer requirements.

A design for the chip assembly is needed that permits the thickness of the substrate to be greatly reduced to enhance heat transfer between the electronic device and the ground plane but simultaneously provides the necessary structural support to the assembly.

Aside from the substrate thickness restricting heat transfer, a further disadvantage of current designs, as mentioned, results from the necessity to size the substrate 16 to adjust impedance of the transmission lines for the assembly. Because of this substrate thickness requirement severe limitations are imposed on the design parameters for the transmission line 14. For uniformity and compatibility with other circuits, the impedance of the transmission line 14 is often fixed by general convention of the circuit designers and it is imperative that the assembly be designed to satisfy this requirement. The impedance of the transmission line is determined by three factors - the electrical resistance of the transmission line itself, the electrical inductance caused from nearby conductors and the electrical capacitance resulting from the transmission line positioned relative to another conductor. Designing for a constant impedance in the transmission line 14 requires considering each of these three factors.

Generally, the resistance of the transmission line is a function of the width, thickness and material of the transmission line itself. The contribution of the transmission line resistance to the overall impedance therefore may be adjusted by altering the transmission line dimensions and material. On the other hand, the inductance of the transmission line is determined not only by the transmission line dimensions and material but by the distance of the transmission line to another electrical conductor, especially the ground plane. Similarly, the capacitance is determined by the distance to another electrical conductor, especially the ground plane and also by the dielectric substance between the transmission line and the ground plane. Subsequently, the impedance contribution from the inductance and the capacitance of the transmission line 14 is largely dependent on the distance from the transmission line to the ground plane and the dielectric constant of the substrate between the transmission line 14 and the ground plane 34.

Specifically, in the case of the chip assembly 10 in FIG. 1, the inductance of the transmission line 14 is directly effected by the distance from the transmission line 14 to the ground plane 34 while the capacitance of the transmission line 14 is effected by the distance from the transmission line 14 to the ground plane 34 and the dielectric constant of the substances between the transmission line 14 and the ground plane 34. In FIG. 1 the dielectric substance between the transmission line 14 and the ground plane 34 is a composite of both the substrate 16 material and the dielectric layer 20 material and subsequently the dielectric constant in this case will be a composite value determined by the dielectric layer 20 and the substrate 16 characteristics. The substrate 16 since it must provide structural support for the assembly typically must be of a thickness of about 4 mils. Because of this, the inductance and the capacitance of the transmission line 14 are essentially determined by the fixed thickness of the substrate 16. For that reason, the only flexibility in the transmission line 14 design for the assembly in FIG. 1 comes through adjusting the impedance by changing the width and the thickness of the transmission line 14. While this does change the overall impedance of the transmission line 14, the effects are not always desirable.

A design is needed for an integrated circuit chip assembly that provides structural support for the entire assembly but at the same time permits adjustment of the inductance and capacitance of the transmission line by moving the ground plane 34 nearer to or farther from the transmission line 14 and by depositing a dielectric substance between the transmission line 14 and the ground plane 34.

FIG. 2 shows a similar integrated circuit chip assembly portion to that shown in FIG. 1, except in FIG. 2 a substrate 40, made of gallium arsenide which is itself insulating, has deposited directly upon a first substrate surface 42 and within the substrate 40 an active electronic device 43 and a transmission line 44. The arrangement of the circuit lines and doped regions is similar to that described for FIG. 1 except the dielectric layer 20, in FIG. 1, is unnecessary and subsequently not included. Because of this exclusion, electrical insulation between the circuit lines of the electronic device 43 is accomplished by spacing the circuit lines apart over the first surface 42 of the substrate 40. Just as with the assembly in FIG. 1, a substrate second surface 45 contacts the surface of a ground plane 46.

FIG. 3 shows another existing design for the integrated circuit chip assembly. This arrangement is identical to that found in FIG. 1 except only a first surface 50 of the substrate 52 is planar. The second surface 54 of the substrate 52 has a concave shape in the region of the electronic device 12. A ground plane 56 contacts and conforms to the second surface 54 of the substrate 52. Through this configuration, the thermal resistance of the substrate 52 in the area of the electronic device 12 is reduced because the thickness of the substrate 52 in that region is reduced, and subsequently heat generated by the electronic device 12 may be more readily dissipated through the ground plane 56. Although not shown in FIG. 3, an enhancing modification to this design would involve the introduction of a thermally and electrically conducting via extending from the ground plane 56 through the substrate 52 to the electronic device 12 such that the thermal resistance of the substrate 52 is largely bypassed by the newly formed thermally conductive path to the ground plane 56 provided by the via. Ideally the via would physically contact the ground plane 56 and either the circuit line 26 (FIG. 1) of the source region 22 or the circuit line 30 of the drain region of the electronic device 12 24 to provide an electrical and thermal ground.

While the arrangement shown in FIG. 3 and the modification described do enhance the ability to dissipate heat from the electronic device 12, the process of forming a concave surface within the substrate 52 material in the region of the electronic device 12 is, in practice, very difficult. This is especially true with substrates made from gallium arsenide because that material is inherently brittle. Furthermore, while this does provide better heat dissipation to the electronic device 12, there is no relief provided to adjust the impedance of the transmission line 14 because the substrate 52 still must function to provide structural support to the entire integrated circuit chip assembly. Consequently the substrate 52 thickness in the region away from the electronic device 12 between the transmission line 14 and the ground plane 56 remains unchanged and the overall impedance generated by the inductance and capacitance of the transmission line therefore remains unchanged. Note the ground plane is not limited to acting as an electrical ground since it may just as easily provide current to components on the substrate.

Note that the same design discussed in FIG. 3 and the associated enhancement also apply to a chip assembly utilizing a substrate made of gallium arsenide. The difference would be the absence of the insulating layer and the direct deposition of circuit lines onto the gallium arsenide substrate surface. The remainder of the design would remain essentially the same.

It is an object of this invention to provide an integrated circuit chip assembly design that permits effective dissipation of heat generated by electronic devices of the assembly.

It is another object of this invention to provide an integrated circuit chip assembly design by which the assembly, is structurally supported in a manner not dependent on the thickness of the substrate.

It is still another object of this invention to provide an integrated circuit chip assembly design that permits adjustment of the impedance of the transmission lines through varying the distance from the transmission line to the ground plane.

It is yet another object of this invention to provide an integrated circuit chip assembly design that permits adjustment of the transmission line impedance through the selection of a dielectric substance for introduction between a transmission line and the ground plane.

SUMMARY OF THE INVENTION

The invention is an improved integrated circuit chip assembly having at least one heat generating electronic device and at least one insulated microstrip transmission line comprising a dielectric substrate having a first surface, a second surface and a predetermined thickness between the first and second surfaces, the substrate having the at least one insulated transmission line defined by a width and a thickness deposited upon the first surface and the substrate at a selected portion having infused therein through selective doping and the substrate having deposited upon the first surface through metallization of the substrate the at least one heat generating electronic device generally defined by a width and a thickness, a ground plane made of a material having high thermal conductivity and having a first surface and a second surface such that the ground plane functions as at least a heat sink and at least one spacing segment comprised of a material having high thermal conductivity interposed between the first surface of the ground plane and the second surface of the substrate, each spacing segment having a width sufficiently large and each segment approximately positioned in a region opposite a heat generating electronic device such that the segment provides a path for heat transfer from the electronic device on the substrate to the ground plane and the segment provides structural support between the substrate and the ground plane.

DESCRIPTION OF THE PREFERRED EMBODIMENT

Figure 1:
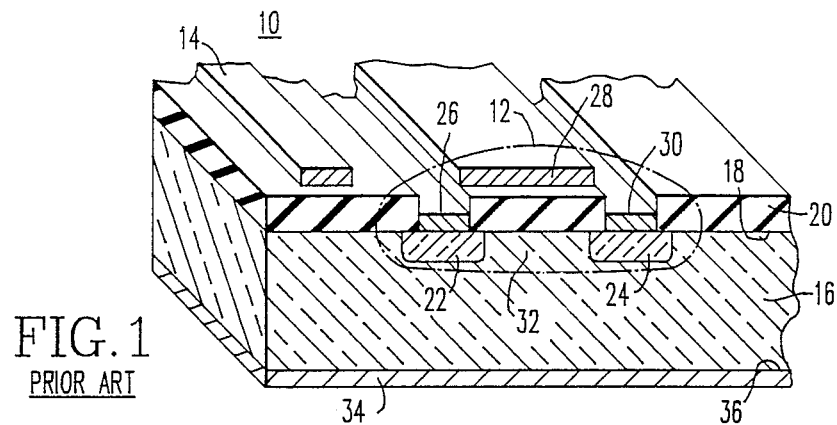
FIG. 1 presents prior art and shows a cross section of a portion of an integrated circuit chip assembly having an active electronic device and a transmission line supported by a substrate made of a material such as silicon or silicon-on-sapphire and having two planar surfaces.
Figure 3:
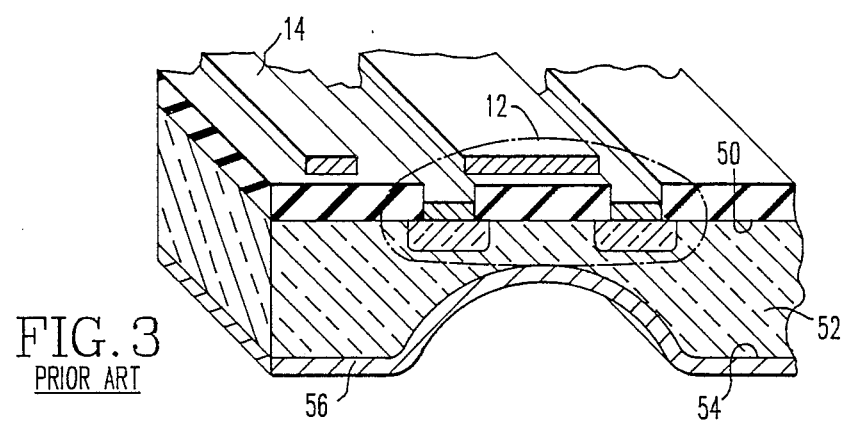
FIG. 3 presents prior art and shows a cross section of a portion of an integrated circuit chip assembly having an active electronic device and a transmission line supported by a substrate having one planar surface and one surface having a concave contour in the region of the active electronic device.
Figure 4:
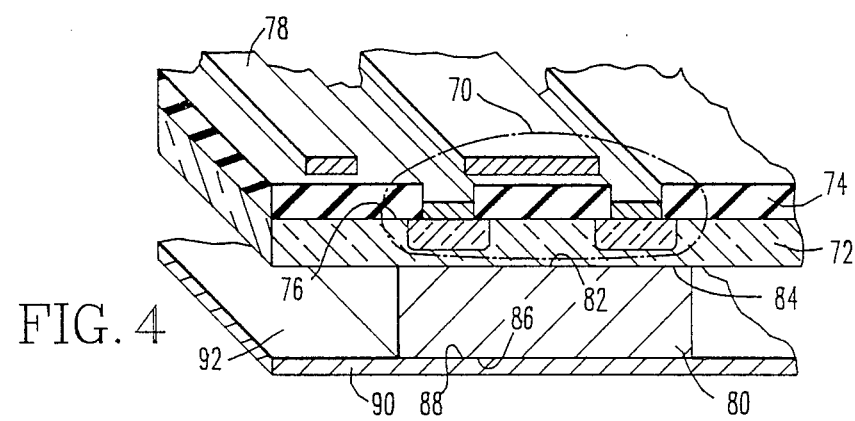
FIG. 4 shows a cross section of a portion of an integrated circuit chip assembly having an active electronic device and a transmission line on a thin substrate having one planar surface and another surface selectively supported by a thermally conductive material in the region of the active electronic device.
Figure 2:
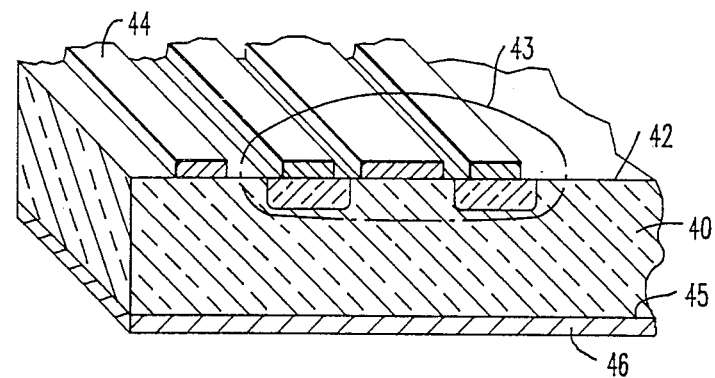
FIG. 2 presents prior art and shows a figure similar to FIG. 1 except with variations introduced to accommodate the substrate material of gallium arsenide.

The preferred embodiment of the invention is illustrated in FIG. 4. Just as shown in FIGS. 1, 2 and 3, an active electronic device 70 is upon and within a substrate 72 made of a material such as silicon, silicon-on-sapphire (SOS) or gallium arsenide (GaAs). As mentioned before, the choice of material depends on the circuit properties required. A dielectric layer 74 is deposited upon a planar first surface 76 of the substrate 72. This dielectric layer 74 is used to isolate elements of the active electronic device 70 and is further used as a means to insulate the transmission line 78 from the substrate 72.

Figure 5:
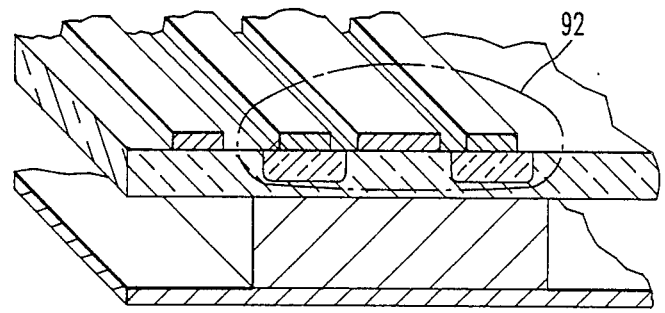
FIG. 5 shows a cross section of a portion of an integrated circuit chip assembly similar to FIG. 4 except with variations introduced to accommodate the substrate material of gallium arsenide.

Note that while a substrate made from silicon or silicon-on-sapphire has an electrical resistivity on the order of magnitude of 10 ohm-cm and therefore requires a dielectric layer such as layer 74 for electrical isolation from transmission and component circuit lines, a substrate made from gallium arsenide, on the other hand, has a resistivity on the order of $10^7$ ohms and therefore requires no such layer. This is illustrated in FIG. 5 and will be further discussed later. Note further that conventional techniques for integrated circuit chip fabrication are utilized for the chip assembly discussed in this embodiment.

Referring again to FIG. 4, a spacing segment 80, made of a thermally conductive dielectric material, has a first surface 82 in direct contact with a planar second surface 84 of the substrate 72.

Because this spacing segment 80 is deposited on the second surface 84, which is a surface that could be called the backside of the substrate, this segment 80 could be referred to as a backside plate to the substrate. As will be described, this spacing segment 80 will be selectively located, and as such the term selective backside deposition is used in the title of this invention.

Returning to FIG. 4, the spacing segment 80 also has a second surface 86 in direct contact with a first surface 88 of a ground plane 90 which is used as a heat sink. The spacing segment 80 has a predetermined thickness between the first surface 82 and the second surface 86 and a width across the cross-sectional cut. Note that the width of the spacing segment 80 is approximately that of the width of the active electronic device 70, which for a field effect transistor is about 0.1 mils.

The material for the spacing segment 80 may be a material having high thermal conductivity and low electrical conductivity such as aluminum oxide or beryllium oxide or the spacing segment may be a material having both high thermal conductivity and high electrical conductivity such as gold, nickel or tin. Two variations of the invention will be presented, each taking advantage of these two combinations of material conductivity. At this point in the discussion the selection of one of the two types of materials is not critical.

The purpose of this spacing segment 80 is three-fold. First, it provides structural reinforcement to the integrated circuit chip assembly so that the thickness of the substrate 72 may be made predetermined by factors such as desired heat transfer through the substrate. The spacing segment 80, in conjunction with other spacing segments, may now provide adequate structural support to the assembly thereby relieving the substrate 72 from that requirement. This feature is true regardless of the material selected from the two types discussed earlier.

Secondly, the spacing segment 80 by providing structural support which permits use of a thinner substrate also provides an improved heat transfer path from the active electronic device 70 to the ground plane 90 which acts as a thermal heat sink. Generally, the substrate 72 material has a high thermal resistance and consequently, any thinning of the substrate material reduces the thermal resistance of the substrate 72 and the spacing segment 80 which by design has a low thermal resistance may more effectively remove heat from the active electronic device 70. This second feature is also true regardless of the material selected from the two types discussed earlier.

Thirdly, the thickness of the spacing segment 80 may be used to adjust the impedance of the transmission line 78. As mentioned earlier, the impedance of the transmission line is fixed by general convention of the integrated circuit chip assembly designers and is effected by three factors.

The first factor is the resistance of the transmission line itself which is a function of transmission line width, thickness and material. The second factor is the electrical inductance of the transmission line. This value is strongly dependent on the distance of the transmission line from the nearest electrical conductor. The third factor is the electrical capacitance of the transmission line which is strongly effected not only by the distance from the transmission line to the nearest electrical conductor, but is also influenced by the medium between the transmission line and the nearest electrical conductor. Subsequently, by adjusting the thickness of the spacing segment 80, the distance between the transmission line 78 and the ground plane 90 may be adjusted.

In this instance the material of the spacing segment may be either of the two types discussed earlier but when the material has high electrical conductivity, then the width of the spacing segment 80 must be such that the segment 80 does not extend so far as to influence the impedance of any transmission lines in the region of the spacing segment 80. On the other hand if the spacing segment 80 is made of a material that has high thermal conductivity but low electrical conductivity, then the precise placement of the spacing segment 80 away from any transmission lines is not as critical since the spacing segment 80 will not by its close proximity to a transmission line effect the impedance of the transmission line.

The introduction of the spacing segment 80 in a region local to the active electronic device 70 provides a gap between the substrate 72 and the ground plane 90 in the region of the transmission line 78. Under these circumstances, a dielectric region 92 is created between the second surface 84 of the substrate 72 and the first surface 88 of the ground plane 90 in the region of the transmission line 14.

Just as the substrate 72 and the dielectric layer 74 have a dielectric constant, so does the region 92. This region 92 effectively acts as a second dielectric layer. By adjusting the thickness of the spacing segment 80, the distance between the second surface 84 of the substrate 72 and the first surface 88 of the ground plane 90 may be increased or decreased which in turn effects the inductance and the capacitance of the transmission line. By adjusting the inductance and the capacitance components of the impedance, flexibility is provided to manipulate the width of the transmission line as the need arises and the transmission line 14 may still be designed with the same predetermined impedance value. This ability to vary the inductance and the capacitance of the transmission line through adjusting the thickness of the spacing segment 80 provides flexibility in the design of the transmission line 78 that was not previously available.

Even more flexibility is now introduced because the dielectric region 92 may be occupied by any of a number of different substances. Most obviously the region 92 would be occupied with air but any substance having a different dielectric constant than air may be utilized. Note that the substance must have a consistency sufficient to remain in the region 92 once initially deposited. This second dielectric region permits the adjustment of the overall impedance of the transmission line thereby providing greater flexibility in the overall integrated circuit chip assembly design.

While a spacing segment of a material having both high thermal conductivity and high electrical conductivity must be precisely positioned to avoid effecting the impedance of nearby transmission lines, on the other hand a spacing segment of this type may be used in conjunction with a member also having high thermal and electrical conductivity which extends through the substrate and simultaneously electrically contacts a circuit line of an electronic component and the ground plane. This not only provides an electrical path to a component but also provides improved heat transfer because now the member provides a path of low thermal resistance through the substrate material.

FIG. 5 shows an arrangement similar to that shown in FIG. 4 except the design modifies the active electronic device 92 to accommodates a substrate made of gallium arsenide and subsequently, as discussed previously, there is no need for the dielectric layer 72 (FIG. 4). Because of this the same discussion of the invention applicable to the design presented in FIG. 4 is applicable to the design in FIG. 5.

Figure 6:
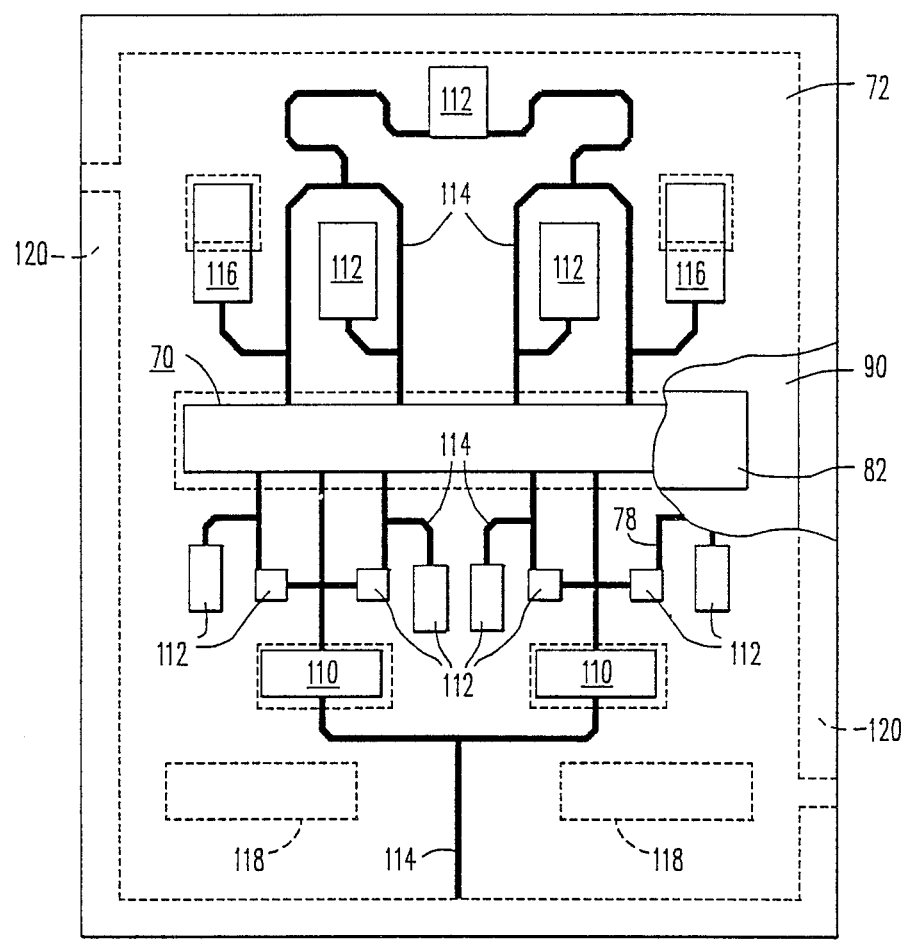
FIG. 6 shows a top view of an integrated circuit chip assembly utilizing one embodiment of this invention.

Up to this point only a portion of an entire integrated circuit chip assembly has been discussed. FIG. 6 shows the top view of a chip assembly 100 utilizing the invention and, more specifically, utilizing the embodiment shown in FIG. 4. Typically the chip assembly is in the shape of a square measuring approximately 0.2 inches on each side. The active electronic device 70 is schematically represented among other active electronic devices 110 and passive components 112. Transmission line 78 is shown among a number of other transmission line clusters 114 which act to interconnect all of the components. Ground pads 116, which are conductive paths to an electrical ground, are also shown.

Note for clarity the dielectric layer 74 shown in FIG. 4 will not be shown and note further that, as mentioned earlier, depending on the substrate material this layer may or may not be needed. If not needed the device design would resemble item 92 in FIG. 4 but the forthcoming discussion will still be applicable.

Addressing the region around device 70, as mentioned in the earlier discussion, the device 70 is deposited upon and within a substrate 72. The substrate 72 actually is the foundation for the integrated circuit chip 100 and therefore has an area equal to that of the chip 100. Beneath the substrate 72 is a ground plane 90, shown for the most part with dotted lines, which has a contour and an area equal to that of the substrate 72 such that the ground plane 90 is directly below the substrate 72. The ground plane 90 may act as both an electrical ground and a thermal heat sink.

A spacing segment 80 is shown between the substrate 72 and the ground plane 90. The segment 80, for illustration, is deliberately shown having a larger area than the electronic device 70 with which it is associated. Note also in FIG. 6 that since the segment 80 is beneath the substrate 72, the segment 80 is for the most part represented by dotted lines. Just as spacing segment 80 is used to provide a heat transfer path between the active electronic device 70 and the ground plane 90, there are other similar spacing segments performing that function for each of the active electronic devices 110 on the substrate 72.

The use of spacing segments is not limited to providing heat transfer paths to electrical devices on the substrate. Specifically, there are two other applications.

The first application is to use spacing segments to provide structural support to the chip assembly. Items 118 in FIG. 6 indicate areas beneath the substrate 72 in which spacing segments have been added to provide structural support. Furthermore the area indicated by item 120, which follows the perimeter of the chip assembly, is provided as peripheral support to the assembly.

The second application is to use the spacing segments as paths for electrical grounding of the chip circuitry. Beneath the ground pads 116 are spacing segments for this purpose. Note that for this function there must be a connecting member extending through the substrate 72 completing the electrical path between the ground pad 116 and the spacing segment, unless the ground pads already extend through the thickness of the substrate.

Each segment in this collection of spacing segments forms part of a much larger patterned layer of material having selected areas with and without material. The material has at least high thermal conductivity and, when used to provide electrical grounding, should also have high electrical conductivity. The patterned layer is disposed in lieu of individual segments between the ground plane 90 and the substrate 72.

Just as the thickness of spacing segment 80 in FIG. 4 is important to control the impedance of the transmission line 78, the thickness of the patterned layer now becomes important for the impedance of all of the transmission line on the substrate and may be selected in a similar manner to that discussed for the segment 80 thickness. Furthermore the gaps created by the spacing segments, which naturally would be filled with air, may be occupied with a selected dielectric substance so that still another feature may be utilized to control the impedance of the transmission lines.

Although this invention has been described with reference to a specific embodiment thereof, numerous modifications are possible without departing from the invention, and it is desirable to cover all modifications falling within the spirit and scope of this invention.

We claim:

1. In an integrated circuit chip assembly having an integrated circuit and at least one microstrip transmission line disposed on a first side of a dielectric substrate and a ground plane acting at least as a heat sink, with the substrate further having a second surface and a predetermined thickness, the integrated circuit having at least one heat generating electronic device within the substrate occupying an area on the substrate, the ground plane having a first and second surface and the at least one transmission line disposed on the substrate first surface and spaced apart from the electronic device, the improvement comprising:
a spacing segment associated with each heat generating device comprised of a material having high thermal conductivity and low electrical conductivity selectively interposed between the first surface of the ground plane and the second surface of the substrate, the segment having an area approximately equal to and approximately conforming to the heat generating device area and positioned against the substrate second surface in a region opposite the heat generating device such that the segment provides a path for heat transfer from the electronic device on the substrate to the ground plane and each segment further provides structural reinforcement to the assembly to permit a smaller substrate thickness and enhance heat transfer from the device to the ground plane.

2. The integrated circuit chip assembly according to claim 1 wherein each spacing segment is further comprised of a specific thickness such that the thickness is selected to dictate a distance and define a volume between the at least one transmission line and the ground plane to adjust the inductive and the capacitive impedance of the transmission line.

3. The integrated circuit chip assembly according to claim 2 wherein the volume is occupied with a selected dielectric substance to further adjust the impedance of the transmission line.

4. The integrated circuit chip assembly according to claim 1 wherein each spacing segment is made of a ceramic material having high thermal conductivity and low electrical conductivity selected from the group consisting of beryllium oxide and aluminum oxide.

5. The integrated circuit chip assembly according to claim 1 wherein the dielectric substrate material is gallium arsenide.

6. The integrated circuit chip assembly according to claim 5 wherein the thickness of the gallium arsenide substrate is approximately 2 mils.

7. The integrated circuit chip assembly according to claim 6 wherein the integrated circuit chip contains a monolithic microwave integrated circuit (MMIC).

8. The integrated circuit chip assembly according to claim 1 wherein the dielectric substrate material is silicon.

9. The integrated circuit chip assembly according to claim 1 wherein the dielectric substrate material is sapphire.

10. In an integrated circuit chip assembly having an integrated circuit and at least one microstrip transmission line disposed on a first side of a dielectric substrate and a ground plane acting as a heat sink and an electrical ground, with the substrate further having a second surface and a predetermined thickness, the integrated circuit having at least one heat generating electronic device within the substrate occupying an area on the substrate, the ground plane having a first and second surface and the at least one transmission line disposed on the substrate first surface and spaced apart from the electronic device, the improvement comprising:

a spacing segment associated with each heat generating device comprised of gold selectively interposed between the first surface of the ground plane and the second surface of the substrate, the segment having an area approximately equal to and approximately conforming to the heat generating device area and positioned against the substrate second surface in a region opposite the heat generating device such that the segment provides a path for heat transfer from the electronic device on the substrate to the ground plane and provides structural reinforcement to the assembly to permit a smaller substrate thickness for enhancing heat transfer from the device to the ground plane and the segment positioned away from transmission lines such that the segment position has a minimum effect on the inductive and capacitive impedance caused by the proximity of the segment to the transmission lines.

11. The integrated circuit chip assembly according to claim 10 further comprising at least one member having both high electrical and thermal conductivity extending through the dielectric substrate and contacting a circuit line of the electronic device and the first surface of a spacing segment to simultaneously provide a path for electrically connecting to the ground plane and also to provide a path for increased heat transfer between the area proximate to the circuit line and the ground plane.

12. The integrated circuit chip assembly according to claim 10 wherein each spacing segment is further comprised of a specific thickness such that the thickness is selected to dictate a distance and define a volume between the at least one transmission line and the ground plane to adjust the impedance of the transmission line.

13. The integrated circuit chip assembly according to claim 12 wherein the volume is occupied with a selected dielectric substance to further adjust the impedance of the transmission line.

14. The integrated circuit chip assembly according to claim 10 wherein each spacing segment is made of a metal having both high thermal conductivity and high electrical conductivity selected from the group consisting of gold, nickel and tin.

15. The integrated circuit chip assembly according to claim 10 wherein the dielectric substrate is gallium arsenide.

16. The integrated circuit chip assembly according to claim 15 wherein the thickness of the gallium arsenide substrate is approximately 2 mils.

17. The integrated circuit chip assembly according to claim 16 wherein the integrated circuit chip contains a monolithic microwave integrated circuit (MMIC).

18. The integrated circuit chip assembly according to claim 10 wherein the dielectric substrate material is silicon.

19. The integrated circuit chip assembly according to claim 10 wherein the dielectric substrate material is sapphire.

20. In an integrated circuit chip assembly having an integrated circuit, at least one microstrip transmission line disposed on a first side of a gallium arsenide substrate and a ground plane acting as a heat sink and an electrical ground, with the substrate further having a second surface and a predetermined thickness, the integrated circuit having at least one heat generating electronic device within the substrate occupying an area on the substrate, the ground plane having a first and second surface and the at least one transmission line disposed on the substrate first surface and spaced apart from the electronic device, the improvement comprising:

a spacing segment associated with each heat generating device comprised of gold selectively interposed between the first surface of the ground plane and the second surface of the substrate, the segment having an area approximately equal to and approximately conforming to the heat generating device area and positioned against the substrate second surface in a region opposite the heat generating device such that the segment provides a path for heat transfer from the electronic device on the substrate to the ground plane and provides structural reinforcement to the assembly to permit a smaller substrate thickness for enhancing heat transfer from the device to the ground plane, the segment positioned away from transmission lines such that the segment position has a minimum effect on the inductive and capacitive impedance caused by the proximity of the segment to the transmission lines, and the segment further having a specified thickness selected to dictate a distance between the at least one transmission line and the ground plane for adjusting the impedance of the at least one transmission line.

21. An integrated circuit chip assembly having at least one heat generating electronic device and at least one insulated microstrip transmission line comprising:

a) a dielectric substrate having a first surface, a second surface and a predetermined thickness between the first and second surfaces, the substrate having the at least one insulated transmission line defined by a width and a thickness deposited upon the first surface and the substrate at a selected portion having infused therein through selective doping and having deposited upon the first surface through metalization of the substrate the at least one heat generating electronic device generally defined by a width and a thickness;

b) a ground plane made of a material having both high thermal conductivity and high electrical conductivity and having a first surface and a second surface such that the ground plane functions as at least a heat sink; and c) a spacing segment associated with each heat generating device comprised of a material having high thermal conductivity and low electrical conductivity selectively interposed between the first surface of the ground plane and the second surface of the substrate, the segment having an area approximately equal to and approximately conforming to the heat generating device area and positioned against the substrate second surface in a region opposite the heat generating device such that the segment provides a path for heat transfer from the electronic device on the substrate to the ground plane and each segment further provides structural reinforcement to the assembly to permit a smaller substrate thickness and enhance heat transfer from the device to the ground plane.

22. The assembly according to claim 21 wherein each spacing segment is further comprised of a specific thickness such that the thickness is selected to dictate a distance and define a volume between the at least one transmission line and the ground plane to adjust the inductive and the capacitive impedance of the transmission line.

23. The integrated circuit chip assembly according to claim 22 wherein the volume is occupied with a selected dielectric substance to further adjust the impedance of the transmission line.

24. The integrated circuit chip assembly according to claim 21 wherein each segment is made of a ceramic material having high thermal conductivity and low electrical conductivity selected from the group consisting of beryllium oxide and aluminum oxide.

25. The integrated circuit chip assembly according to claim 21 wherein the dielectric substrate is gallium arsenide.

26. The integrated circuit chip assembly according to claim 25 wherein the thickness of the gallium arsenide substrate is approximately 2 mils.

27. The integrated circuit chip assembly according to claim 26 wherein the integrated circuit chip contains a monolithic microwave integrated circuit (MMIC).

28. The integrated circuit chip assembly according to claim 21 wherein the dielectric substrate material is silicon.

29. The integrated circuit chip assembly according to claim 21 wherein the dielectric substrate material is sapphire.

30. An integrated circuit chip assembly having at least one heat generating electronic device and at least one insulated microstrip transmission line comprising:
 a) a dielectric substrate made of gallium arsenide having a first surface, a second surface and a predetermined thickness between the first and second surfaces, the substrate having the at least one insulated transmission line defined by a width and a thickness deposited upon the first surface and the substrate at a selected portion having infused therein through selective doping and the substrate having deposited upon the first surface through metalization of the substrate the at least one heat generating electronic device generally defined by a width and a thickness;
 b) a ground plane made of a material having both a high thermal conductivity and a high electrical conductivity and having a first surface and a second surface such that the ground plane functions as at least a heat sink; and
 c) a spacing segment associated with each heat generating device comprised of a material having high thermal conductivity and low electrical conductivity selectively interposed between the first surface of the ground plane and the second surface of the substrate, the segment having an area approximately equal to and approximately conforming to the heat generating device area and positioned against the substrate second surface in a region opposite the heat generating device such that the segment provides a path for heat transfer from the electronic device on the substrate to the ground plane and each segment further provides structural reinforcement to the assembly to permit a smaller substrate thickness and enhance heat transfer from the device to the ground plane.

31. The integrated circuit chip assembly according to claim 30 further comprising at least one member having both high electrical and thermal conductivity extending through the dielectric substrate and contacting a circuit line of the electronic device and the first surface of the spacing segment to simultaneously provide a path for electrically connecting to the ground plane and also to provide a path for increased heat transfer between the area proximate to the circuit line and the ground plane.

32. The assembly according to claim 30 wherein each spacing segment is further comprised of a specific thickness such that the thickness is selected to dictate a distance and define a volume between the at least one transmission line and the ground plane to adjust the inductive and the capacitive impedance of the transmission line.

33. The integrated circuit chip assembly according to claim 30 wherein the volume is occupied with a selected dielectric substance to further adjust the impedance of the transmission line.

34. The integrated circuit chip assembly according to claim 30 wherein each segment is made of a metal having both high thermal conductivity and high electrical conductivity selected from a group consisting of gold, nickel and tin.

35. The integrated circuit chip assembly according to claim 30 wherein the dielectric substrate is gallium arsenide.

36. The integrated circuit chip assembly according to claim 35 wherein the thickness of the gallium arsenide substrate is approximately 2 mils.

37. The integrated circuit chip assembly according to claim 30 wherein the integrated circuit chip contains a monolithic microwave integrated circuit (MMIC).

38. The integrated circuit chip assembly according to claim 30 wherein the dielectric substrate material is silicon.

39. The integrated circuit chip assembly according to claim 30 wherein the dielectric substrate material is sapphire.

40. An integrated circuit chip assembly comprising:
 a) a substrate made of a semiconductor material having deposed upon and within at least one active electronic device and having deposed upon at least one insulated microstrip transmission line;
 b) a ground plane made of a material having high thermal conductivity; and
 c) a patterned layer of a material with thermal conductivity and with a specific thickness having selected areas with and without material, the layer disposed between the substrate and the ground plane to provide structural stiffness for the assembly, to provide a heat transfer path between the at least one electronic device to the ground plane and to provide spacing between the at least one transmission line and the ground plane to control transmission line impedance, the layer areas having material aligned between the at least one electronic device and the ground plane and spaced at regular intervals to provide structural support between the substrate and the ground plane and the layer areas without material providing a gap between the at least one transmission line and the ground plane.

41. The integrated circuit chip assembly according to claim 40 further comprising a dielectric substance disposed within the area of the patterned layer without material.

* * * * *